(12) United States Patent
Vaithianathan

(10) Patent No.: US 7,561,082 B2
(45) Date of Patent: Jul. 14, 2009

(54) HIGH PERFORMANCE RENORMALIZATION FOR BINARY ARITHMETIC VIDEO CODING

(75) Inventor: Karthik Vaithianathan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/618,551

(22) Filed: Dec. 29, 2006

(65) Prior Publication Data

US 2008/0162911 A1 Jul. 3, 2008

(51) Int. Cl.
H03M 7/00 (2006.01)
(52) U.S. Cl. .......................... 341/107; 708/491
(58) Field of Classification Search .......... 341/107; 708/491
See application file for complete search history.

(56) References Cited

U.S. PATENT DOCUMENTS 6,748,410 B1 * 6/2004 Gressel et al. ............ 708/491
7,183,951 B2 * 2/2007 Bossen .................... 341/107
7,304,590 B2 * 12/2007 Park ....................... 341/107
2002/0014981 A1 2/2002 Bengio et al.
2005/0001746 A1 * 1/2005 Sankaran ................. 341/107
2006/0017591 A1 1/2006 Bossen
2006/0028359 A1 2/2006 Kim et al.

FOREIGN PATENT DOCUMENTS

WO 2008082941 A1 7/2008

* cited by examiner

Primary Examiner—Jean B Jeanglaude
(74) Attorney, Agent, or Firm—Kacvinsky LLC

(57) ABSTRACT

During high performance renormalization for video encoding, renormalization may involve detecting a leading number of '0's in a range value of an input stream of symbols, a run of '1's in an offset value of the input stream of symbols, and a run of '0's following the run of '1' in the offset value. A bitstream may be outputted based on an iteration window for a number of renormalization iterations. The iteration window may comprise a bit range after the run of '1's in the offset value, and the number of renormalization iterations may be based on the leading number of '0's in the range value. A run of '1's followed by one or more '0's may be identified as a particular pattern.

40 Claims, 5 Drawing Sheets

200

```
┌─────────────────────────────────────────┐
│ RECEIVE AN INPUT STREAM OF SYMBOLS      │
│ COMPRISING A RANGE VALUE AND AN OFFSET  │
│ VALUE                                   │
│ 202                                     │
└─────────────────────────────────────────┘
                    │
┌─────────────────────────────────────────┐
│ DETERMINE A NUMBER OF RENORMALIZATION   │
│ ITERATIONS BASED ON A LEADING NUMBER    │
│ OF '0'S IN THE RANGE VALUE              │
│ 204                                     │
└─────────────────────────────────────────┘
                    │
┌─────────────────────────────────────────┐
│ RENORMALIZE THE RANGE VALUE             │
│ 206                                     │
└─────────────────────────────────────────┘
                    │
┌─────────────────────────────────────────┐
│ DETERMINE A NEW RANGE VALUE AND A NEW   │
│ OFFSET VALUE BASED ON THE NUMBER OF     │
│ RENORMALIZATION ITERATIONS              │
│ 208                                     │
└─────────────────────────────────────────┘
                    │
┌─────────────────────────────────────────┐
│ DETECT A LEADING RUN OF '1'S IN THE     │
│ RANGE VALUE                             │
│ 210                                     │
└─────────────────────────────────────────┘
                    │
┌─────────────────────────────────────────┐
│ DETECT A LEADING RUN OF '0'S FOLLOWING  │
│ THE LEADING RUN OF '1'S IN THE OFFSET   │
│ VALUE                                   │
│ 212                                     │
└─────────────────────────────────────────┘
                    │
┌─────────────────────────────────────────┐
│ DETERMINE AN ITERATION WINDOW           │
│ 214                                     │
└─────────────────────────────────────────┘
                    │
┌─────────────────────────────────────────┐
│ GENERATE BITSTREAM BASED ON THE         │
│ ITERATION WINDOW FOR THE NUMBER OF      │
│ RENORMALIZATION ITERATIONS              │
│ 216                                     │
└─────────────────────────────────────────┘
```

FIG. 2

HIGH PERFORMANCE RENORMALIZATION FOR BINARY ARITHMETIC VIDEO CODING

BACKGROUND

Various techniques for coding video are described in standards promulgated by organizations such as the Moving Picture Expert Group (MPEG), the International Telecommunications Union (ITU), the International Organization for Standardization (ISO), and the International Electrotechnical Commission (IEC). For example, Context Adaptive Binary Arithmetic Coding (CABAC) is an entropy coding requirement specified in the H.264/AVC standard ITU-T/ISO/IEC H.264/MPEG-4 (Part 10) Advanced Video Coding (Video Coding for Very Low Bit Rate Communication, ITU-T Recommendation H.264 (May 2003), ITU-T Recommendation H.264: Advanced video coding for generic audiovisual services, ISO/IEC 14496-10:2005 (E)).

CABAC involves arithmetic coding which is quite high in computational complexity. Arithmetic coding takes a stream of symbols as input and outputs a floating point number between 0 and 1 based on the probability of occurrence of each symbol in the input stream. The longer the input stream size, the more bits required to represent the floating point number. In order to avoid this floating point number from overflowing, a renormalization process is used.

The renormalization process uses a range value (e.g., codIRange) and an offset value (e.g., codILow) to output bits at every clock into a compressed bitstream. Binary arithmetic encoding is used to modify the codIRange value and the codILow value at every clock and to provide the modified values as inputs for the next clock. The values are used again and again in a iterative loop. When values outside a certain range or window, the values are renormalized and brought back within the window.

The renormalization process generally involves restricting a nine bit codIRange value and a 10 bit codILow value to specific ranges. If the codIRange value falls within a 0-255 range, the codIRange value is pushed into a 256-511 range by multiplying the codIRange value by 2 repeatedly (e.g., in N steps).

For the N iterations, if the codILow value falls in the 256-511 range, the codILow value is subtracted by 256 while incrementing a bitsOutstanding value. If the codILow value falls in the 512-1023 range, the codILow value is subtracted by 512 while outputting '1'. If the codILow value falls in the 0-255 range, the codILow value is multiplied by 2 while outputting '0'.

This renormalization process is sequential in nature and is a bottleneck in achieving a high throughput CABAC encoder. Current solutions for CABAC renormalization are software based and take multiple cycles to normalize one value. Hardware based solutions generally take 3 to 5 cycles per bit. Typical CABAC encoders output 1 bit for every 3 to 5 clocks on the average. This means for 200 MHz clock frequency, at 1 bit for every 4 clocks, the encoding bit rate is 50 Mbps. Therefore, to encode higher bitrate video streams at real time requires higher frequency of operation.

BRIEF DESCRIPTION OF THE DRAWINGS

FIG. 2 a logic flow for renormalization in accordance with one or more embodiments.

DETAILED DESCRIPTION

Various embodiments are directed to performing high performance renormalization for video encoding such as CABAC encoding according to the H.264/AVC standard. In one or more embodiments, renormalization may involve detecting a leading number of '0's in a range value of an input stream of symbols, a run of '1's in an offset value of the input stream of symbols, and a run of '0's following the run of '1' in the offset value. A bitstream may be outputted based on an iteration window for a number of renormalization iterations. The iteration window may comprise a bit range after the run of '1's in the offset value, and the number of renormalization iterations may be based on the leading number of '0's in the range value.

In various implementations, the range value may be renormalized by shifting the range value by the leading number of '0's. New range values and new offset values may be determined based on the number of renormalization iterations. The offset value may fall in an upper range if significant bits of the offset value comprise a run of '1's in the iteration window and a value of '1' may be outputted to the bitstream. The offset value may be reduced by the lowest value of the upper range after an iteration and multiplied to put the offset value back into the upper range. The offset value may fall below the upper range during the run of '0's and a value of '0' may be outputted to the bitstream. The iteration window may be latched into a register and the number of bits outstanding may be incremented if a last bit in the register comprises a '1'. Otherwise, a value of '0' may be outputted to the bitstream. In some embodiments, a run of '1's followed by one or more '0's may be identified as a particular pattern.

Figure 1:
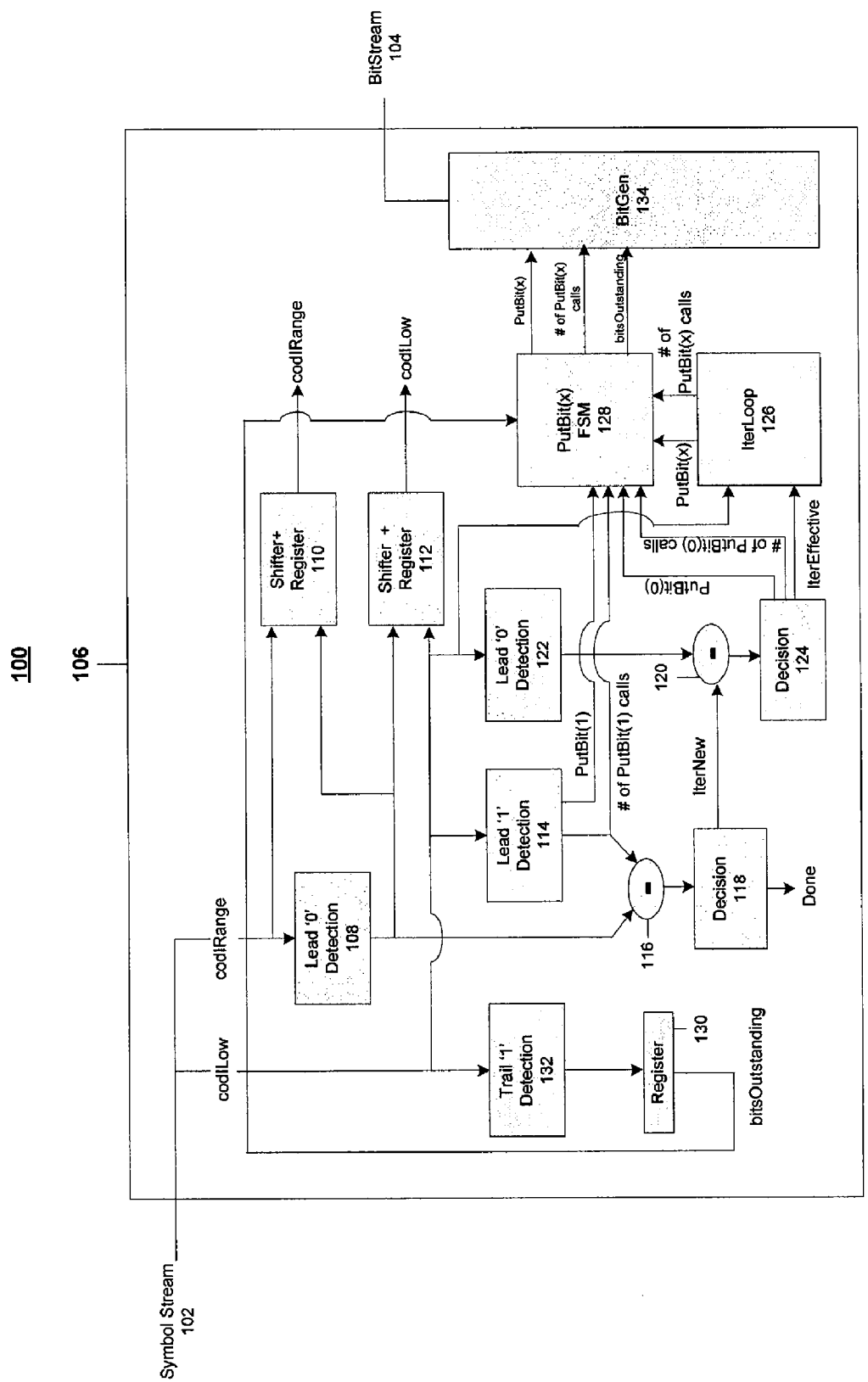
FIG. 1 illustrates a media processing system comprising a renormalizer apparatus in accordance with one or more embodiments.

FIG. 1 illustrates a media processing system 100 in accordance with one or more embodiments. In general, the media processing system 100 may comprise various physical and/or logical components for communicating information which may be implemented as hardware, software, or any combination thereof, as desired for a given set of design parameters or performance constraints. Although FIG. 1 may show a limited number of components by way of example, it can be appreciated that a greater or a fewer number of components may be employed for a given implementation.

In some embodiments, the media processing system 100 may be implemented for a PC, consumer electronics (CE), and/or mobile platform as a system within and/or connected to a device such as personal PC, STB, digital TV device, Internet Protocol TV (IPTV) device, digital camera, media player, and/or cellular telephone. Other examples of such devices may include, without limitation, a workstation, terminal, server, media appliance, audio/video (A/V) receiver, digital music player, entertainment system, digital TV (DTV) device, high-definition TV (HDTV) device, direct broadcast satellite TV (DBS) device, video on-demand (VOD) device, Web TV device, digital video recorder (DVR) device, digital versatile disc (DVD) device, high-definition DVD (HD-DVD) device, Blu-ray disc (BD) device, video home system (VHS) device, digital VHS device, a gaming console, display device, notebook PC, a laptop computer, portable computer, handheld computer, personal digital assistant (PDA), voice over IP (VoIP) device, combination cellular telephone/PDA, smart phone, pager, messaging device, wireless access point (AP), wireless client device, wireless station (STA), base station (BS), subscriber station (SS), mobile subscriber center (MSC), mobile unit, and so forth.

In mobile applications, for example, the media processing system 100 may be implemented within and/or connected to a device comprising one more interfaces and/or components for wireless communication such as one or more transmitters, receivers, transceivers, chipsets, amplifiers, filters, control logic, network interface cards (NICs), antennas, and so forth. Examples of an antenna may include, without limitation, an internal antenna, an omni-directional antenna, a monopole antenna, a dipole antenna, an end fed antenna, a circularly polarized antenna, a micro-strip antenna, a diversity antenna, a dual antenna, an antenna array, and so forth.

In various embodiments, the media processing system 100 may form part of a wired communications system, a wireless communications system, or a combination of both. For example, the media processing system 100 may be arranged to communicate information over one or more types of wired communication links. Examples of a wired communication link, may include, without limitation, a wire, cable, bus, printed circuit board (PCB), Ethernet connection, peer-to-peer (P2P) connection, backplane, switch fabric, semiconductor material, twisted-pair wire, co-axial cable, fiber optic connection, and so forth. The media processing system 100 also may be arranged to communicate information over one or more types of wireless communication links. Examples of a wireless communication link may include, without limitation, a radio channel, satellite channel, television channel, broadcast channel infrared channel, radio-frequency (RF) channel, Wireless Fidelity (WiFi) channel, a portion of the RF spectrum, and/or one or more licensed or license-free frequency bands. Although certain embodiments may be illustrated using a particular communications media by way of example, it may be appreciated that the principles and techniques discussed herein may be implemented using various communication media and accompanying technology.

In various embodiments, the media processing system 100 may be arranged to operate within a network, such as a Wide Area Network (WAN), Local Area Network (LAN), Metropolitan Area Network (MAN), wireless WAN (WWAN), wireless LAN (WLAN), wireless MAN (WMAN), wireless personal area network (WPAN), Worldwide Interoperability for Microwave Access (WiMAX) network, broadband wireless access (BWA) network, the Internet, the World Wide Web, telephone network, radio network, television network, cable network, satellite network such as a direct broadcast satellite (DBS) network, Code Division Multiple Access (CDMA) network, third generation (3G) network such as Wide-band CDMA (WCDMA), fourth generation (4G) network, Time Division Multiple Access (TDMA) network, Extended-TDMA (E-TDMA) cellular radiotelephone network, Global System for Mobile Communications (GSM) network, GSM with General Packet Radio Service (GPRS) systems (GSM/GPRS) network, Synchronous Division Multiple Access (SDMA) network, Time Division Synchronous CDMA (TD-SCDMA) network, Orthogonal Frequency Division Multiplexing (OFDM) network, Orthogonal Frequency Division Multiple Access (OFDMA) network, North American Digital Cellular (NADC) cellular radiotelephone network, Narrowband Advanced Mobile Phone Service (NAMPS) network, Universal Mobile Telephone System (UMTS) network, and/or any other wired or wireless communications network configured to carry data in accordance with the described embodiments.

The media processing system 100 may be arranged to communicate one or more types of information, such as media information and control information. Media information generally may refer to any data representing content meant for a user, such as image information, video information, audio information, A/V information, graphical information, voice information, textual information, numerical information, alphanumeric symbols, character symbols, and so forth. Control information generally may refer to any data representing commands, instructions or control words meant for an automated system. For example, control information may be used to route media information through a system, or instruct a node to process the media information in a certain manner. The media and control information may be communicated from and to a number of different devices or networks.

In various implementations, the media information and control information may be segmented into a series of packets. Each packet may comprise, for example, a discrete data set having a fixed or varying size represented in terms of bits or bytes. It can be appreciated that the described embodiments are applicable to any type of communication content or format, such as packets, frames, fragments, cells, windows, units, and so forth.

The media processing system 100 may communicate information in accordance with one or more protocols. A protocol may comprise a set of predefined rules or instructions for managing communication among nodes. In various embodiments, for example, the media processing system 100 may employ one or more protocols such as medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), and so forth.

The media processing system 100 may communicate information in accordance with one or more standards as promulgated by a standards organization, such as the ITU, the ISO, the IEC, the Institute of Electrical and Electronics Engineers (IEEE), the Internet Engineering Task Force (IETF), and so forth. In various embodiments, for example, the media processing system 100 may communicate information according to media processing standards such as, for example, the H.264/AVC standard, the ITU/IEC H.263 standard (Video Coding for Low Bitrate Communication, ITU-T Recommendation H.263v3, published November 2000), MPEG standards (e.g., MPEG-1, MPEG-2, MPEG-4), Digital Video Broadcasting (DVB) terrestrial (DVB-T) standards, DVB satellite (DVB-S or -S2) standards, DVB cable (DVB-C) standards, DVB terrestrial for handhelds (DVB-H), National Television System Committee (NTSC) and Phase Alteration by Line (PAL) standards, Advanced Television Systems Committee (ATSC) standards, Society of Motion Picture and Television Engineers (SMPTE) standards such as the SMPTE 421M or VC-1 standard based on Windows Media Video (WMV) version 9, Digital Transmission Content Protection over Internet Protocol (DTCP-IP) standards, High performance radio Local Area Network (HiperLAN) standards, and so forth.

In some implementations, the media processing system 100 may be arranged to receive media content from a media source. The media source generally may comprise various devices and/or systems capable of delivering static or dynamic media content to the media processing system 100. In one embodiment, for example, the media source may comprise or form part of an image acquisition device such as a video camera or mobile device with imaging capabilities. The media source also may comprise a multimedia server arranged to provide broadcast or streaming media content. In other embodiments, the media source may comprise or form part of a media distribution system (DS) or broadcast system such as an over-the-air (OTA) broadcast system, DVB system, radio broadcast system, satellite broadcast system, and so forth. The media source may be implemented within a VOD system or interactive television system that allows users to select, receive, and view video content over a network. The media source also may comprise or form part of an IPTV system that delivers digital television content over an IP connection, such as a broadband connection.

The media processing system 100 may be coupled to the media source through various types of communication channels capable of carrying information signals such as wired communication links, wireless communication links, or a combination of both, as desired for a given implementation. The media processing system 100 also may be arranged to receive media content from the media source through various types of components or interfaces. For example, the media processing system 100 may be arranged to receive media content through one or more tuners and/or interfaces such as an OpenCable (OC) tuner, NTSC/PAL tuner, tuner/demodulator, point-of-deployment (POD)/DVB common interface (DVB-CI), A/V decoder interface, Ethernet interface, PCI interface, and so forth.

The media content delivered to the media processing system 100 may comprise various types of information such as image information, audio information, video information, A/V information, and/or other data. In some implementations, the media source may be arranged to deliver media content in various formats for use by a device such as a STB, IPTV device, VOD device, media player, and so forth.

The media content may be delivered as compressed media content to allow the media processing system 100 to efficiently store and/or transfer data. In various implementations, the media content may be compressed by employing techniques such as spatial compression using discrete cosine transform (DCT), temporal compression, motion compensation, and quantization. Video compression of the media content may be performed, for example, in accordance with standards such as H.264, MPEG-2, MPEG-4, VC-1, and so forth. In some cases, the media content may be delivered as scrambled and/or encrypted media content to prevent unauthorized reception, copying, and/or viewing.

The media processing system 100 may be arranged to process one or more types of information, such as video information. Video information generally may refer to any data derived from or associated with one or more video images. For example, video information may comprise one or more of video data, video sequences, group of pictures (GOP), pictures, images, regions, objects, frames, slices, macroblocks, blocks, pixels, signals (e.g., Y, U, and V), and so forth. The values assigned to pixels may comprise real numbers and/or integer numbers.

The media processing system 100 may be arranged to perform video coding, such as entropy encoding. In one or more embodiments, the media processing system 100 may be implemented within and/or coupled to an entropy encoder, such as a CABAC encoder or any other suitable entropy encoder consistent with the described embodiments. While some embodiments may be described as implementing CABAC encoding for purposes of illustration, it can be appreciated that various aspects of the described embodiments may find applicability in other video coding and/or decoding techniques such as variable length coding (VLC), context-based adaptive variable length coding (CAVLC), and so forth.

When implemented by a CABAC encoder, for example, the media processing system 100 may be arranged to use arithmetic coding according to the H.264/AVC standard and to encode values using a non-integer or fractional number of bits per symbol. The media processing system 100 also may be arranged to adaptively adjust to dynamic symbol statistics and to use context modeling based on observed relevant syntax elements.

The media processing system 100 may be arranged to receive and encode a symbol stream 102 and to output an encoded bitstream 104 comprising a sequence of compressed video bits. In one or more embodiments, the symbol stream 102 may comprise symbols for various syntax elements. Examples of syntax elements may include one or more of slice payload data, macroblock type and/or block pattern, intra prediction modes, reference frame indexes, motion vectors, quantized transform coefficients, and so forth.

In various implementations, the symbol stream 102 may be provided from a quantizer. In such implementations, the quantizer may be arranged to quantize transformed (e.g., forward DCT) coefficients and output residue coefficients according to a quantization factor and/or quantization matrix. The residue may relate to differences in predicted and/or actual content (e.g., pixels, motion vectors) such as differences between blocks of a current frame and one or more reference frames.

As shown in FIG. 1, the media processing system 100 may comprise a renormalizer apparatus 106. In various embodiments, the renormalizer apparatus may be arranged to optimize the datapath for CABAC encoding and renormalization. The renormalizer apparatus 106 may be implemented, for example, to perform high performance renormalization for applications and/or products where a very high throughput is required at lower clock frequencies such as high definition (HD) applications and products (e.g., HD-capable H.264 encoder, multi-stream HD encoder, more than HD resolution encoder (4000×3000 pixels) for digital cinema applications, etc.) The embodiments, however, are not limited in this context.

As illustrated, the renormalizer apparatus 106 may comprise a plurality of functional components or modules. The modules may be implemented by one or more chips or integrated circuits (ICs) and may comprise, for example, hardware and/or software such as logic (e.g., instructions, data, and/or code) to be executed by a logic device. Examples of a logic device include, without limitation, a central processing unit (CPU), micro controller, microprocessor, general purpose processor, dedicated processor, chip multi processor (CMP), media processor, digital signal processor (DSP), network processor, co-processor, input/output (I/O) processor, application specific integrated circuit (ASIC), field programmable gate array (FPGA), programmable logic device (PLD), and so forth. Executable logic may be stored internally or externally to a logic device on one or more types of computer-readable storage media such as volatile or non-volatile memory, removable or non-removable memory, erasable or non-erasable memory, writeable or re-writeable memory, and so forth. The modules may be physically or logically coupled and/or connected by communications media comprising wired communication media, wireless communication media, or a combination of both, as desired for a given implementation. In some embodiments, the plurality of modules may be implemented as a system-on-a-chip (SOC.) By a single chip or integrated circuit (IC). The embodiments are not limited in this context.

As shown, the renormalizer apparatus 106 may receive a symbol stream 102. In one or more embodiments, the symbol stream 102 may comprise a range value and an offset value. In various implementations, the range value may comprise a nine bit (e.g., $B_0$-$B_8$) codIRange value, and the offset value may comprise a ten bit (e.g., $B_0$-$B_9$) codILow value.

The renormalizer apparatus 106 may comprise a lead '0' detection module 108. In one or more embodiments, the lead '0' detection module 108 may be arranged to receive the range value codIRange and to detect the leading number of '0's before the first '1' in the range value codIRange from left to right. The lead '0' detection module 108 may determine a number of renormalization iterations based on a leading number of '0's in the range value codIRange and may set a renormalization iteration number IterN equal to the leading number of '0's. In various implementations, the minimum value of the renormalization iteration number IterN may be 1, and the maximum value of the renormalization iteration number IterN may be 8.

The renormalizer apparatus 106 may comprise a first shifter and register module 110 and a second shifter and register module 112 coupled to the lead '0' detection module 108. The shifter and register modules 110, 112 may be implemented, for example, by barrel shifter logic and registers. The first shifter and register module 110 may receive the range value codIRange and the renormalization iteration number IterN as inputs. The second shifter and register module 112 may receive the offset value codILow and the renormalization iteration number IterN as inputs.

In one or more embodiments, the first shifter and register module 110 may be arranged to renormalized the range value codIRange. For example, the range value codIRange may comprise a nine bit value (e.g., $B_0$-$B_8$), and renormalization of the range value codIRange may be obtained by repeated left shifts until a '1' appears in the bit eight ($B_8$) position. In various implementations, the number of shifts ShiftN to renormalized the range value codIRange corresponds to the number of renormalization iterations as well as the leading number of '0's in the range value codIRange.

The shifter and register modules 110, 112 may be arranged to determine a new range value codIRange and a new offset value codILow to be used for a subsequent step of arithmetic encoding based on the renormalization iteration number IterN. In one or more embodiments, the new range value codIRange may be obtained from the first shifter and register module 110 by a left shift of the range value codIRange by the renormalization iteration number IterN (e.g., codIRange=codIRange<<IterN). The new offset value codILow may be obtained from the second shifter and register module 112 by a left shift of the offset value codILow by the renormalization iteration number IterN (e.g., codILow=codILow<<IterN). In various implementations the new codIRange value and the new codILow value may be generated by the shifter and register modules 110, 112 in one cycle.

The renormalizer apparatus 106 may comprise a lead '1' detection module 114. In one or more embodiments, the lead '1' detection module 114 may be arranged to receive the offset value codILow and to detect a leading run of '1's in the offset value codILow. For example, the lead '1' detection module 114 may set a leading run of '1's value LeadOneN to the number of '1's from bit position $B_9$ to bit position $B_0$ of the offset value codILow.

The renormalizer apparatus 106 may comprise a subtraction module 116 coupled to the lead '0' detection module 108 and the lead '1' detection module 114. The subtraction module 116 may set a new iteration value IterNew equal to the difference between the renormalization iteration number IterN and the number of leading '1's (e.g., IterNew=IterN−LeadOneN). The subtraction module 116 may provide the IterNew value to a decision module 118. In one or more embodiments, the decision module 118 may end the renormalization loop if the IterNew value is less than or equal to 0.

The decision module 118 may provide the IterNew value to a subtraction module 120 coupled to a lead '0' detection module 122. In one or more embodiments, the lead '0' detection module 122 may be arranged to detect a leading run of '0's in the offset value codILow. The leading run of '0's may follow a leading run of '1's in the range value codILow. If there is a run of '1's in the range value, a OneWindow value may be set equal to the LeadOneN value. If there is no run of '1's (e.g., LeadOneN=0), the OneWindow value may be set equal to 1. The lead '0' detection module 122 may set a leading run of '0's value LeadZeroN to the number of '0's from the bit position $B_{9-OneWindow}$ to bit position $B_0$ of the offset value codILow.

The subtraction module 120 may be arranged to determine an effective iteration value IterEffective set equal to the difference between the new iteration value IterNew and the number of '0's following the run of '1's (e.g., IterEffective=IterNew−LeadZeroN).

The subtraction module 120 may provide the IterEffective value to a decision module 124. If the run length is greater than effective iteration value IterEffective (e.g., IterEffective<0), the decision module 124 may instruct that a value of '0' be put into the bitstream for a number of times corresponding to the absolute value of the effective iteration value IterEffective.

The decision module 124 may be coupled to an inter loop module 126. In one or more embodiments, the interloop module 126 may receive the IterEffective value and the codILow value and latch the bit range after the run of '1's in the offset value codILow into a register (e.g., eight bit register A[8:0]).

The renormalizer apparatus 106 may comprise a finite state machine (FSM) module 128. The FSM module 128 may be coupled to the lead '1' detection module 114, the decision module 124, and the inter loop module 126. In one or more embodiments, the FSM module may receive a PutBit(1) instruction and a number of PutBit(1) calls instruction from the lead '1' detection module 114. The FSM module may receive a PutBit(0) instruction and a number of PutBit(0) calls instruction from the decision module 124. The FSM module 128 may receive a PutBit(x) instruction and a number of PutBit(x) calls instruction from the interloop module 126. The FSM module 128 also may receive a bitsOutstanding value from a register 130 coupled to a trail '1' detection module 132 arranged to detect a sequence of '1's in the codILow value.

In one or more embodiments, the FSM module 128 may be arranged to provide a PutBit(x) instruction, a number of PutBit(x) calls instruction, and bitsOutstanding value to a bit generation module 134. The bit generation module 134 may arranged to output the bitstream 104 in response to the PutBit(x) instruction, a number of PutBit(x) calls instruction, and bitsOutstanding value received from the FSM module 128. In various implementations the bit generation module 130 may be arranged to generate the bitstream 104 as follows.

If there are consecutive '1's in the most significant bit positions (e.g., starting with bit position $B_9$) of the offset value codIRange, the offset value codILow may fall within a 512-1023 range when entering the renormalization loop. For example, if bit positions $B_9$ and below contains a run of '1's in the iteration window bit range IterWindow, then after every iteration, the offset value codILow is reduced by 512 and multiplied by 2 to put the offset value codILow back in the 512-1023 range while outputting '1' to the bitstream. In various implementations, during renormalization for the number of renormalization iterations IterN, once the codILow value falls to the 0-255 range, it may never again fall in 512-1023 range.

For the detected run of '0's after the detected leading run of '1's, the offset value codILow may fall in a 0-511 range during the run of '0's, and a value of '0' may be outputted to the bitstream. In one or more embodiments, a new iteration value IterNew may be set equal to the difference between the number of renormalization iterations and the number of leading '1's (e.g., IterNew=IterN−LeadOneN). If the IterNew value is less than or equal to 0, the renormalization loop may end.

An effective iteration value IterEffective may be set equal to the difference between the new iteration value IterNew and the number of '0's following the run of '1's (e.g., IterEffective=IterNew−LeadZeroN). If the run length is greater than effective iteration value IterEffective (e.g., IterEffective<0), a value of '0' is put into the bitstream for a number of times corresponding to the absolute value of the effective iteration value IterEffective.

If the run length is not greater than effective iteration value IterEffective (e.g., IterEffective>0), the iteration window comprising the bits after the run of '1's in the offset value codILow is latched into a register (e.g., eight bit register A[8:0]). For the iteration window, if the last bit in the register is a '1', the number of bits outstanding is incremented (e.g., bitsOutstanding++). Otherwise, a value of '0' is put into the bitstream and the register is left shifted by 1 (e.g., A[8:0]<<1). It can be appreciated that it may take up to 8 clock cycles to complete the iteration window.

FIG. 2 illustrates a logic flow 200 for renormalization in accordance with one or more embodiments. In various embodiments, the logic flow 200 may be performed by various systems, devices, units, and/or components and may be implemented as hardware, software, and/or any combination thereof, as desired for a given set of design parameters or performance constraints. The logic flow 200 may be implemented, for example, by the renormalizer apparatus 106 (e.g., multi-cycle renormalization unit) illustrated in FIG. 1. The embodiments, however, are not limited in this context.

The logic flow 200 may comprise receiving an input stream of symbols comprising a range value and an offset value (block 202). In one or more embodiments, the range value may comprise a nine bit (e.g., $B_0$-$B_8$) codIRange value, and the offset value may comprise a ten bit (e.g., $B_0$-$B_9$) codILow value.

The logic flow 200 may comprise determining a number of renormalization iterations based on a leading number of '0's in the range value (block 204). In one or more embodiments, the leading number of '0's before the first '1' in the range value codIRange is detected from left to right. A renormalization iteration number IterN is set based on the leading number of '0's. In various implementations, the minimum value of the renormalization iteration number IterN may be 1, and the maximum value of the renormalization iteration number IterN may be 8.

The logic flow may comprise renormalized the range value (block 206). In one or more embodiments, the range value codIRange may comprise a nine bit value (e.g., $B_0$-$B_8$), and renormalization of the range value codIRange may be obtained by repeated left shifts until a '1' appears in the bit eight ($B_8$) position. In various implementations, the number of shifts ShiftN to renormalized the range value codIRange corresponds to the number of renormalization iterations as well as the leading number of '0's in the range value.

The logic flow 200 may comprise determining a new range value and a new offset value to be used for a subsequent step of arithmetic encoding based on the number of renormalization iterations (block 208). In one or more embodiments, the new range value codIRange may be obtained by a left shift of the range value codIRange by the renormalization iteration number IterN (e.g., codIRange=codIRange<<IterN). The new offset value codILow may be obtained by a left shift of the offset value codILow by the renormalization iteration number IterN (e.g., codILow=codILow<<IterN). In various implementations the new codIRange value and the new codILow value may be generated in one cycle.

The logic flow 200 may comprise detecting a leading run of '1's in the range value (block 210). In one or more embodiments, a leading run of '1's value LeadOneN may be set to the run of '1's from bit position $B_9$ to bit position $B_0$ of the offset value codILow. If there is a run of '1's in the range value, a OneWindow value may be set equal to the LeadOneN value. If there is no run of '1's (e.g., LeadOneN=0), the OneWindow value may be set equal to 1.

The logic flow 200 may comprise detecting a leading run of '0's following the leading run of '1's in the offset value (block 212). A leading run of '0's value LeadZeroN may be determined by detecting a leading run of '0's from the bit position $B_{9-OneWindow}$ to bit position $B_0$ of the offset value codILow.

The logic flow 200 may comprise determining an iteration window (block 214). In one or more embodiments, the iteration window may comprise a bit range after the run of '1's in the offset value codILow. For example, if there is a run of '1's (e.g., LeadOneN !=0) in the offset value codILow, an iteration window value IterWindow may be set equal to a bit range comprising the bit position $B_{9-OneWindow}$ to bit position $B_{9-IterN}$ of the offset value codILow. If there is not a run of '1's, the iteration window value IterWindow may be set equal to a bit range comprising the bit position $B_8$ to bit position $B_{8-IterN}$ of the offset value codILow.

The logic flow 200 may comprise generating a bitstream based on the iteration window for the number of renormalization iterations (block 216). If there are consecutive '1's in the most significant bit positions (e.g., starting with bit position $B_9$) of the offset value codIRange, the offset value codILow may fall within a 512-1023 range when entering the renormalization loop. For example, if bit positions $B_9$ and below contains a run of '1's in the iteration window bit range IterWindow, then after every iteration, the offset value codILow is reduced by 512 and multiplied by 2 to put the offset value codILow back in the 512-1023 range while outputting '1' to the bitstream. In various implementations, during renormalization for the number of renormalization iterations IterN, once the codILow value falls to the 0-255 range, it may never again fall in 512-1023 range.

For the detected run of '0's after the detected leading run of '1's, the offset value codILow may fall in a 0-511 range during the run of '0's, and a value of '0' may be outputted to the bitstream. In one or more embodiments, a new iteration value IterNew may be set equal to the difference between the number of renormalization iterations and the number of leading '1's (e.g., IterNew=IterN−LeadOneN). If the IterNew value is less than or equal to 0, the renormalization loop may end.

An effective iteration value IterEffective may be set equal to the difference between the new iteration value IterNew and the number of '0's following the run of '1's (e.g., IterEffective=IterNew−LeadZeroN). If the run length is greater than effective iteration value IterEffective (e.g., IterEffective<0), a value of '0' is put into the bitstream for a number of times corresponding to the absolute value of the effective iteration value IterEffective.

If the run length is not greater than effective iteration value IterEffective (e.g., IterEffective>0), the iteration window comprising the bits after the run of '1's in the offset value codILow is latched into a register (e.g., eight bit register A[8:0]). For the iteration window, if the last bit in the register is a '1', the number of bits outstanding is incremented (e.g., bitsOutstanding++). Otherwise, a value of '0' is put into the bitstream and the register is left shifted by 1 (e.g., A[8:0]<<1). It can be appreciated that it may take up to 8 clock cycles to complete the iteration window.

One embodiment of an algorithm or pseudo code to implement the renormalization logic flow 200 is as follows:

```
1. Let IterN = ShiftN = # of shifts from codIRange renormalization
process (# of leading 0's before the first '1' from left to right of
codIRange). IterNmax = 8; IterNmin = 1;
    2. Left Shift codILow by IterN to get new codILow i.e., codILow =
codILow << IterN
    3. Left Shift codIRange by IterN to get new codIRange i.e.,
codIRange = codIRange << IterN
    4. Let LeadOneN = Leading run of '1's in the range B9 to B0 of
        codILow
    5. Let OneWindow = LeadOneN if (LeadOneN != 0) else '1'.
    6. Let LeadZeroN = Leading run of '0's in the range B9-OneWindow
to B0 of codILow
    7. Let IterWindow = B9-OneWindow to B9-IterN if
(LeadOneN != 0) else B8 to B8-IterN
    8. To Generate BitStream do the following:
        a.    PutBit(1) for LeadOneN times;
        b.    IterNew= IterN − LeadOneN;
        c.    If (IterNew <= 0) Done;
        d.    IterEffective = IterNew − LeadZeroN;
        e.    If (IterEffective < 0) {
        f.       PutBit(0) for abs (IterEffective) times;
        g.       Done;
        h.    }
        i.    If (IterEffective > 0){
        j.       Latch the IterWindow of CodeILow into a register A[8:0]
        k.       While (InterEffective) {
        l.          If (A[8] is '1' ){
        m.             bitsOutstanding++;
        n.          }
        o.          else {
        p.             PutBit(0);
        q.          }
        r.          IterEffective−−;
        s.          Shift left A[8:0] by 1. i.e., A[8:0] << 1;
        t.       }
        u.    }
```

It can be appreciated that in various implementations of the renormalization logic flow 200 and/or algorithm, the number of iterations (IterN) for the renormalization loop is equal to the leading number of '0's before the first '1' in the codIRange value from left to right. Renormalization of codIRange may be obtained by repeated left shifts until a '1' appears in bit position $B_8$. During codILow renormalization iterations (IterN), once the value falls to 0-255 range, it may never again fall in 512-1023 range. The only possibility for codILow to fall in 512-1023 range is when there are consecutive '1's in the most significant positions starting from bit position $B_9$ while entering the renormalization loop.

Figure 3:
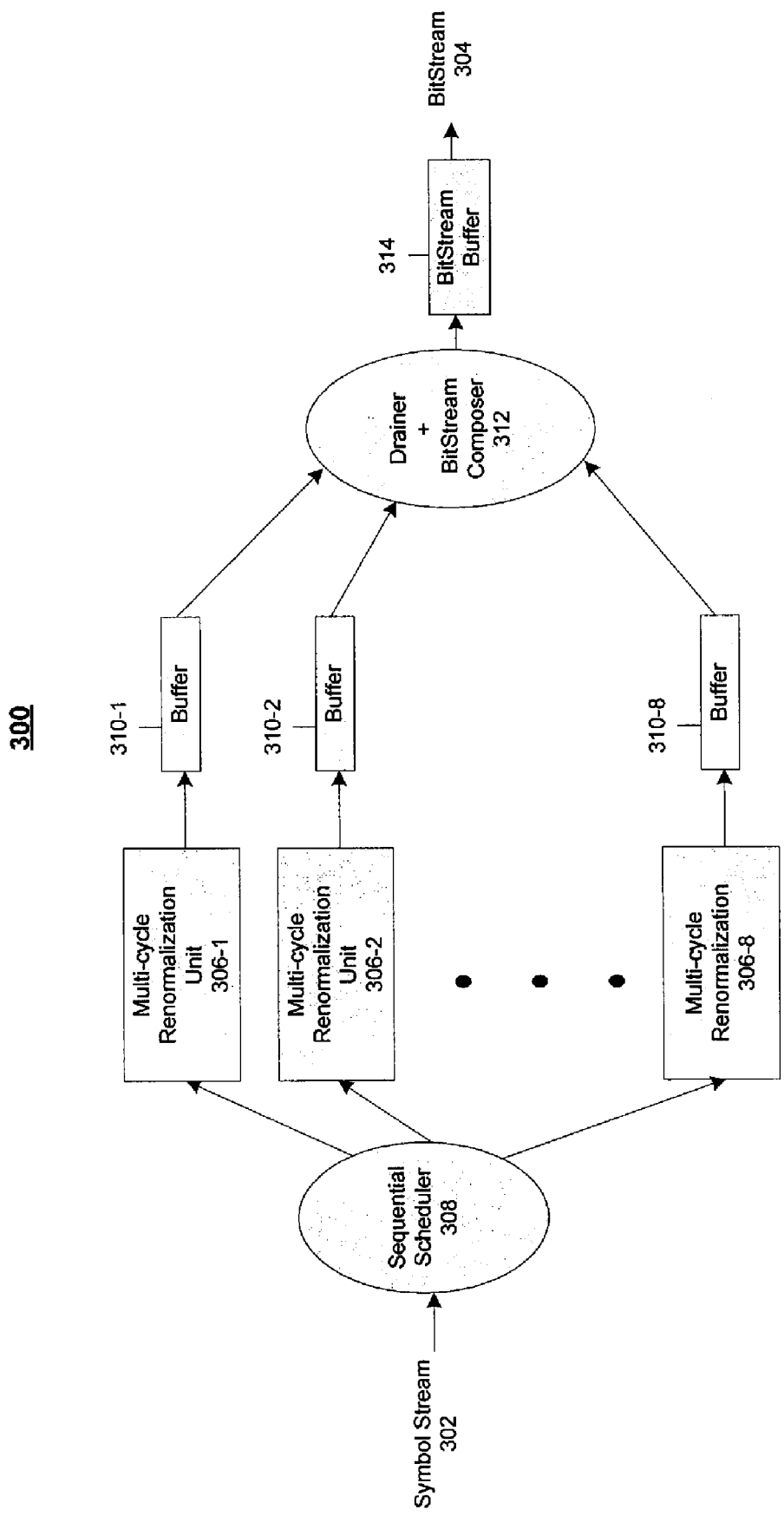
FIG. 3 illustrates a renormalizer system in accordance with one or more embodiments.

FIG. 3 illustrates a renormalizer system 300 in accordance with one or more embodiments. In various embodiments, the renormalizer system 300 may be used to implement the logic flow 200 of FIG. 2. The embodiments, however, are not limited in this context.

The renormalizer system 300 may be arranged to receive and encode a symbol stream 302 and to output an encoded bitstream 304 comprising a sequence of compressed video bits. The renormalizer system 300 may comprise a plurality of multi-cycle renormalizer units 306-1-X, where X represents any positive integer value consistent with the described embodiments. In one or more embodiments, each multi-cycle renormalizer unit 306-1-X may be implemented by the renormalizer apparatus 106 of FIG. 1. The embodiments, however, are not limited in this context.

As illustrated in FIG. 3, renormalizer system 300 may comprise eight multi-cycle renormalization units 306-1-8 to implement a single-cycle renormalization. In various implementations, the renormalizer system 300 may comprise a multi-cycle architecture to achieve single clock performance of one bit per clock.

The renormalizer system 300 may comprise a scheduler module 308 coupled to the multi-cycle renormalization units 306-1-8. In one or more embodiments, the scheduler module 308 may be arranged to distribute the incoming values to be renormalized to each of the multi-cycle renormalizer units 306-1-8 in a sequence. In such embodiments, after 8 clocks, the scheduler modules 308 may return to the first multi-cycle renormalizer unit 306-1. Even assuming a worst case of 8 cycles to renormalized each value, at the 9th clock, the first multi-cycle renormalizer unit 306-1 is ready to receive the next value. Similarly, at the 10th clock, the second multi-cycle renormalizer unit 306-2 is ready to receive the next value, and so forth.

At the outputs of the multi-cycle renormalizer units 306-1-8, are corresponding buffers 310-1-8 which feed into a drainer and bitstream composer module 312 for collecting the outputs. In one or more embodiments, the drainer and bitstream composer module 312 may be implemented as a first-in-first out (FIFO) drainer to drain the bits from output of each multi-cycle renormalizer unit 306-1-8 in a sequential manner to compose the final bitstream. In various implementations, one or more bits can be generated at each of the iterations by the drainer and bitstream composer module 312. Sometimes, however, no bits are generated. To take into account such traffic bursts, a bitstream buffer 314 may be provided at the output to absorb this burstiness.

While values for bitsOutstanding typically are in the range of 30 to 100, in some implementations, the bitsOutstanding value can grow as high as the size of a slice. A higher value for bitsOutstanding will result in higher burstiness. To accommodate this burstiness, the drainer and bitstream composer module 312 may comprise a 128 bit register which can dump 128 bits in a clock to the bitstream.

In various implementations, the renormalizer system 300 may provide a throughput of 1 bit/cycle to 10 bits/clock. In such implementations, the renormalizer system 300 may be arranged to receive one codILow value for every clock and create a bitstream without any back pressure. Thus at 1 bit/cycle throughput rate, the renormalizer system 300 may achieve a 50 Mbps throughput using a 50 MHz clock. Additionally, the architecture of the renormalizer system 300 is highly pipelined and scalable both from clock frequency and performance perspectives. For example, the average encoding throughput may be 10 bits/cycle, and at 250 MHz clock, the renormalizer system 300 may encode a bitstream at 2.5 Gbps.

Figure 4:
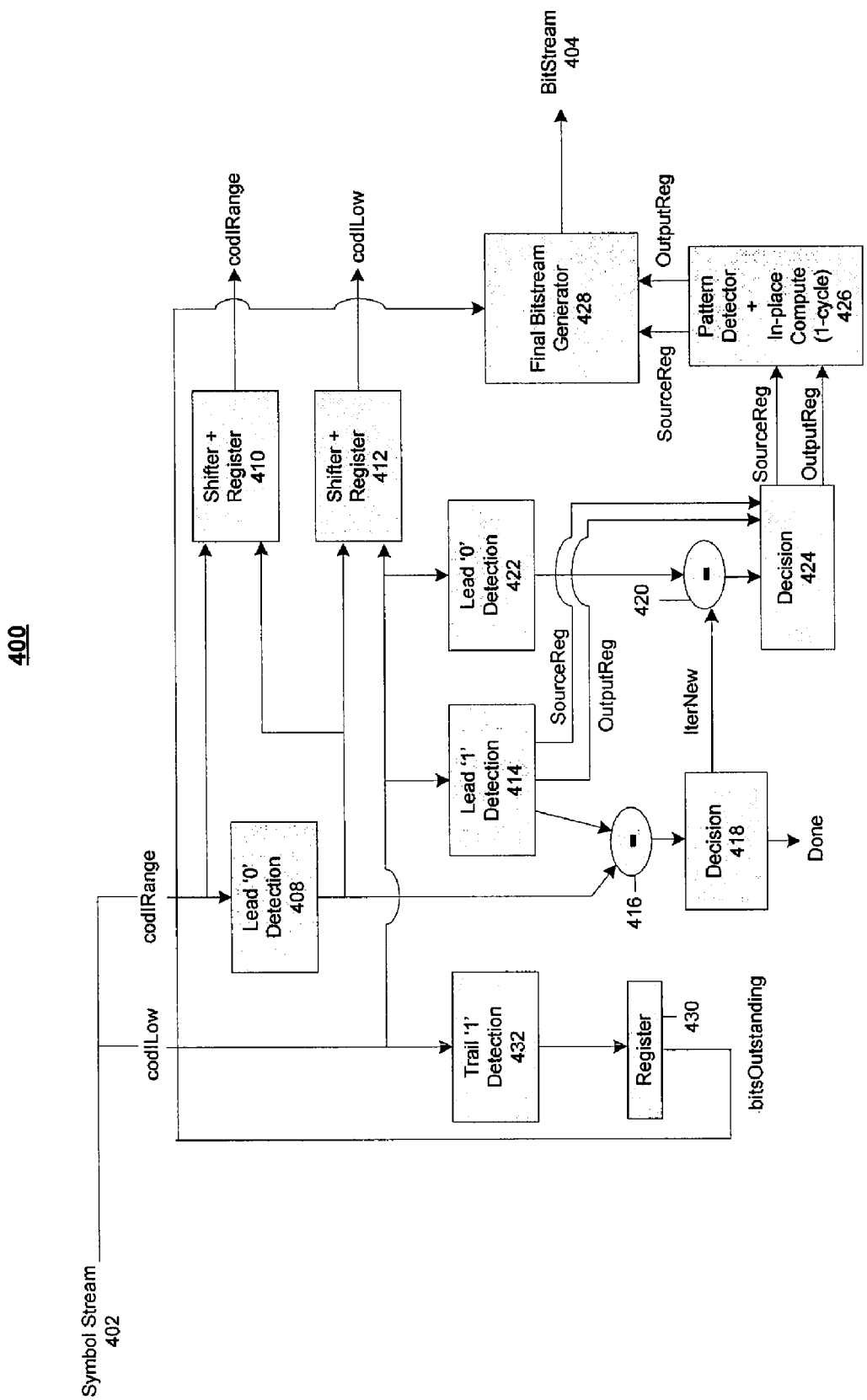
FIG. 4 illustrates a renormalizer apparatus in accordance with one or more embodiments.

FIG. 4 illustrates a renormalizer apparatus 400 in accordance with one or more embodiments. In various embodiments, the renormalizer apparatus 400 may be used to implement the logic flow 200 of FIG. 2. The embodiments, however, are not limited in this context.

As shown, the renormalizer apparatus 400 may receive a symbol stream 402 comprising a range value and an offset value. The range value may comprise a nine bit (e.g., $B_0$-$B_8$) codIRange value, and the offset value may comprise a ten bit (e.g., $B_0$-$B_9$) codILow value. In one or more embodiments, the renormalizer apparatus 400 may be implemented as a single-cycle renormalizer capable of outputting a one bit per clock bitstream 404.

The renormalizer apparatus 400 may comprise a lead '0' detection module 408, a first shifter and register module 410, a second shifter and register module 412, a lead '1' detection module 414, a subtraction module 416, a decision module 418, a subtraction module 420, a lead '0' detection module 422, and a decision module 424. In various embodiments, such elements may be implemented substantially as described above in connection with the renormalizer apparatus 106 of FIG. 1. In various implementations the codILow value is sent through the lead '1' detection module 414 and the decision module 424 which handle two of the three renormalization cases as described above.

As shown, the renormalizer apparatus 400 may comprise a pattern detector and in-place computation module 426. In the renormalization apparatus 400, the output of the decision module 424 (e.g., SourceReg, OutputReg) is fed to the pattern detector and in-place computation module 426 which completes the renormalization flow. At each logic stage, the codILow value bits are modified. No shifting of bits is done any stage. Therefore, all the bit manipulation operations can be completed in one cycle.

In one or more embodiments, the pattern detector and in-place computation module 402 may be arranged to identify a run of '1's followed by one or more '0's as a particular pattern. Detected runs of '1's may comprise several possible patterns such as "10" to "11111110". Additionally, for each pattern there are several positions possible. For the "10" pattern, for example, there are seven positions possible starting from $B_7$ to $B_1$. A sequence of eight '1's may be detected using the trail '1' detection module 432.

In some cases, specific patterns require special treatment. For example, if a run of '1's is found, no bits are dumped into the bitstream until a breaking condition is found. The breaking condition is the occurrence of either a zero in the current codILow value to be encoded or zero/one in the next codILow value to be encoded.

In one or more embodiments, the pattern detector and in-place computation module 426 may be arranged to prioritize certain patterns. For example, if a pattern "10" and a pattern "110" are both asserted for the same bit ending positions, the pattern "110" may be given higher priority. The pattern detector and in-place computation module 426 may be arranged to perform in-place computation where patterns are bit reversed. For example, a codILow value of 11011010 is converted to 01101101, which in turn, gets written into the bitstream.

In various embodiments, by employing the parallel pattern detection and in-place computation techniques, the renormalizer apparatus 400 may implement a single cycle renormalizer at the cost of extra die area. In various implementations, the renormalizer apparatus 400 may provide a throughput of 1 bit/cycle to 10 bits/clock. Accordingly, the renormalizer apparatus 400 may achieve a 50 Mbps throughput using a 50 MHz clock or 5 MHz clock. For a system running at 25 MHz clock, an average encoding throughput of 250 Mbps may be achieved. Additionally, the architecture of the renormalizer apparatus 400 is highly pipelined and scalable both from clock frequency and performance perspectives. For example, the average encoding throughput may be 10 bits/cycle, and at 250 MHz clock, the renormalizer apparatus 400 may encode a bitstream at 2.5 Gbps.

Figure 5:
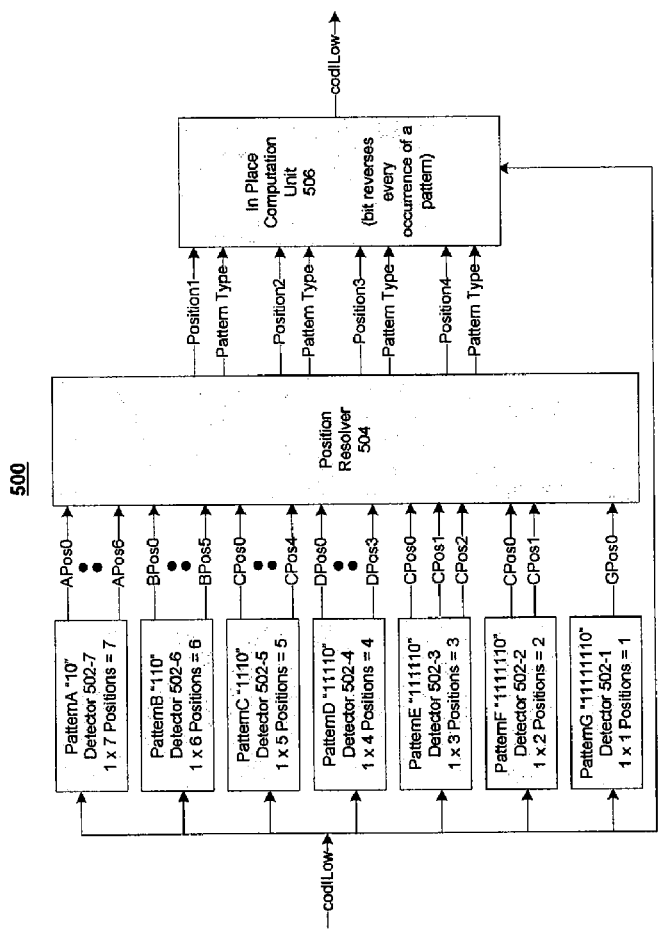
FIG. 5 illustrates a pattern detector and in-place computation module in accordance with one or more embodiments.

FIG. 5 illustrates a pattern detector and in-place computation module 500 in accordance with one or more embodiments. The pattern detector and in-place computation module 500 may be implemented, for example, within the renormalizer apparatus 400 of FIG. 4. The embodiments, however, are not limited in this context.

The pattern detector and in-place computation module 500 may comprise a plurality of pattern detectors 502-1-Y, where Y represents any positive integer value consistent with the described embodiments. For example, a total of 28 pattern detectors 502-1-Y (e.g., N=28) may be employed to cover all patterns and all positions.

As illustrated in FIG. 5, the pattern detector and in-place computation module 500 may comprise seven pattern detectors 502-1-7 coupled to a position resolver 504. Detected runs of ones may comprise several possible patterns such as "10" to "11111110". Additionally, for each pattern there are several positions possible. For the "10" pattern, for example, there are seven positions possible starting from $B_7$ to $B_1$. In this embodiment, the seven pattern detectors 502-1-7 may correspond to seven possible patterns comprising runs of ones "10" to "11111110".

In various implementations, signals from each of the pattern detectors 502-1-7 are sent to the position resolver 504. In one or more embodiments, if signals from pattern "10" and from pattern "110" are asserted for the same bit ending positions, the pattern "110" may be given higher priority. The position resolver 504 may be arranged to feed the final positions and runs to an in-place computation unit 506 where patterns are bit reversed. For example, a codILow value of 11011010 is converted to 01101101, which in turn, gets written into the bitstream.

Figure 6:
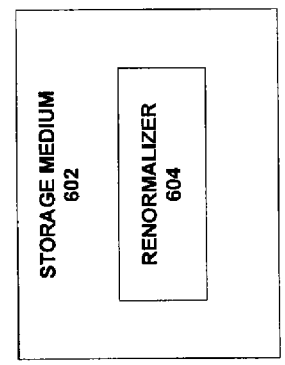
FIG. 6 illustrates an article of manufacture comprising renormalizer logic in accordance with one or more embodiments.

FIG. 6 illustrates one embodiment of an article of manufacture 600. As shown, the article 600 may comprise a storage medium 602 to store renormalizer logic 604 for performing various operations in accordance with the described embodiments. In various embodiments, the article 600 may be implemented by various systems, components, and/or modules.

The article 600 and/or storage medium 602 may include one or more types of computer-readable storage media capable of storing data, including volatile memory or, non-volatile memory, removable or non-removable memory, erasable or non-erasable memory, write able or re-write able memory, and so forth. Examples of a computer-readable storage medium may include, without limitation, random-access memory (RAM), Dynamic RAM (DRAM), Synchronous DRAM (SDRAM), Double-Data-Rate RAM (DDR RAM), DDR SDRAM, static RAM (SRAM), read-only memory (ROM), programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk (e.g., floppy disk, hard drive, optical disk, magnetic disk, magneto-optical disk), or card (e.g., magnetic card, optical card), tape, cassette, or any other type of computer-readable storage media suitable for storing information.

The article 600 and/or storage medium 602 may store renormalizer logic 604 comprising instructions, data, and/or code that, if executed, cause a computer or computer system to perform a method and/or operations in accordance with the described embodiments. Such a computer or computer system may include, for example, any suitable processing platform, computing platform, computing device, processing device, computing system, processing system, processor, or the like, and may be implemented using any suitable combination of hardware and/or software.

The renormalizer logic 604 may comprise, or be implemented as, software, a software module, an application, a program, a subroutine, instructions, an instruction set, computing code, words, values, symbols or combination thereof. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Numerous specific details have been set forth to provide a thorough understanding of the embodiments. It will be understood, however, that the embodiments may be practiced without these specific details. In other instances, well-known operations, components and circuits have not been described in detail so as not to obscure the embodiments. It can be appreciated that the specific structural and functional details are representative and do not necessarily limit the scope of the embodiments.

Various embodiments may comprise one or more elements. An element may comprise any structure arranged to perform certain operations. Each element may be implemented as hardware, software, or any combination thereof, as desired for a given set of design and/or performance constraints. Although an embodiment may be described with a limited number of elements in a certain topology by way of example, the embodiment may include more or less elements in alternate topologies as desired for a given implementation.

It is worthy to note that any reference to "one embodiment" or "an embodiment" means that a particular feature, structure, or characteristic described in connection with the embodiment is included in at least one embodiment. The appearances of the phrase "in one embodiment" in the specification are not necessarily all referring to the same embodiment.

Although some embodiments may be illustrated and described as comprising exemplary functional components or modules performing various operations, it can be appreciated that such components or modules may be implemented by one or more hardware components, software components, and/or combination thereof. The functional components and/or modules may be implemented, for example, by logic (e.g., instructions, data, and/or code) to be executed by a logic device (e.g., processor). Such logic may be stored internally or externally to a logic device on one or more types of computer-readable storage media.

Some of the figures may include a flow diagram. Although such figures may include a particular logic flow, it can be appreciated that the logic flow merely provides an exemplary implementation of the general functionality. Further, the logic flow does not necessarily have to be executed in the order presented unless otherwise indicated. In addition, the logic flow may be implemented by a hardware element, a software element executed by a processor, or any combination thereof.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within registers and/or memories into other data similarly represented as physical quantities within the memories, registers or other such information storage, transmission or display devices.

It is worthy to note that some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. With respect to software elements, for example, the term "coupled" may refer to interfaces, message interfaces, API, exchanging messages, and so forth.

While certain features of the embodiments have been illustrated as described above, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a plurality of detection modules to detect a leading number of '0's in a range value of an input stream of symbols, a run of '1's in an offset value of the input stream of symbols, and a run of '0's following the run of '1' in the offset value; and
a bitstream generation module to output a bitstream based on an iteration window for a number of renormalization iterations, the iteration window comprising a bit range after the run of '1's in the offset value, the number of renormalization iterations based on the leading number of '0's in the range value.

2. The apparatus of claim 1, the apparatus to renormalized the range value by shifting the range value by the leading number of '0's.

3. The apparatus of claim 1, the apparatus to determine a new range value and a new offset value based on the number of renormalization iterations.

4. The apparatus of claim 1, the apparatus to determine that the offset value falls in an upper range if significant bits of the offset value comprise a run of '1's in the iteration window and to output a value of '1' to the bitstream.

5. The apparatus of claim 4, the apparatus to reduce the offset value by the lowest value of the upper range after an iteration and to multiply the reduced offset value to put the offset value back into the upper range.

6. The apparatus of claim 1, the apparatus to determine that the offset value falls below an upper range during the run of '0's and to output a value of '0' to the bitstream.

7. The apparatus of claim 1, the apparatus to latch the iteration window into a register and to increment a number of bits outstanding if a last bit in the register comprises a '1' and to otherwise output a value of '0' to the bitstream.

8. The apparatus of claim 7, the apparatus to shift the register by one bit each time the number of bits outstanding is incremented.

9. The apparatus of claim 1, further comprising a pattern detection module to identify a run of '1's followed by one or more '0's as a particular pattern.

10. The apparatus of claim 9, the bitstream generation module to output a bitstream at a throughput of 1 bit per cycle.

11. A system, comprising:
   a plurality of multi-cycle renormalization units, each multi-cycle renormalization unit comprising:
   a plurality of detection modules to detect a leading number of '0's in a range value of an input stream of symbols, a run of '1's in an offset value of the input stream of symbols, and a run of '0's following the run of '1' in the offset value; and
   a bitstream generation module to output a bitstream based on an iteration window for a number of renormalization iterations, the iteration window comprising a bit range after the run of '1's in the offset value, the number of renormalization iterations based on the leading number of '0's in the range value.

12. The system of claim 11, the plurality of multi-cycle renormalization units to renormalized the range value by shifting the range value by the leading number of '0's.

13. The system of claim 11, plurality of multi-cycle renormalization units to determine a new range value and a new offset value based on the number of renormalization iterations.

14. The system of claim 11, the plurality of multi-cycle renormalization units to determine that the offset value falls in an upper range if significant bits of the offset value comprise a run of '1's in the iteration window and to output a value of '1' to the bitstream.

15. The system of claim 14, the plurality of multi-cycle renormalization units to reduce the offset value by the lowest value of the upper range after an iteration and to multiply the reduced offset value to put the offset value back into the upper range.

16. The system of claim 11, the plurality of multi-cycle renormalization units to determine that the offset value falls below an upper range during the run of '0's and to output a value of '0' to the bitstream.

17. The system of claim 11, the plurality of multi-cycle renormalization units to latch the iteration window into a register and to increment a number of bits outstanding if a last bit in the register comprises a '1' and to otherwise output a value of '0' to the bitstream.

18. The system of claim 17, the plurality of multi-cycle renormalization units to shift the register by one bit each time the number of bits outstanding is incremented.

19. The system of claim 11, further a drainer and bitstream composer coupled to the plurality of multi-cycle renormalization units, the drainer and bitstream composer to output a bitstream at a throughput of 1 bit per cycle.

20. The system of claim 11, further comprising a media source to couple to the plurality of multi-cycle renormalization units.

21. A method, comprising:
   detecting a leading number of '0's in a range value of an input stream of symbols, a run of '1's in an offset value of the input stream of symbols, and a run of '0's following the run of '1' in the offset value; and
   outputting a bitstream based on an iteration window for a number of renormalization iterations, the iteration window comprising a bit range after the run of '1's in the offset value, the number of renormalization iterations based on the leading number of '0's in the range value.

22. The method of claim 21, further comprising renormalizing the range value by shifting the range value by the leading number of '0's.

23. The method of claim 21, further comprising determining a new range value and a new offset value based on the number of renormalization iterations.

24. The method of claim 21, further comprising determining that the offset value falls in an upper range if significant bits of the offset value comprise a run of '1's in the iteration window and outputting a value of '1' to the bitstream.

25. The method of claim 24, further comprising reducing the offset value by the lowest value of the upper range after an iteration and multiplying the reduced offset value to put the offset value back into the upper range.

26. The method of claim 21, further comprising determining that the offset value falls below an upper range during the run of '0's and to output a value of '0' to the bitstream.

27. The method of claim 21, further comprising latching the iteration window into a register and incrementing a number of bits outstanding if a last bit in the register comprises a '1' and otherwise outputting a value of '0' to the bitstream.

28. The method of claim 27, further comprising shifting the register by one bit each time the number of bits outstanding is incremented.

29. The method of claim 21, further comprising identifying a run of '1's followed by one or more '0's as a particular pattern.

30. The method of claim 29, further comprising outputting a bitstream at a throughput of 1 bit per cycle.

31. An article comprising a computer-readable storage medium containing instructions that if executed enable a system to:
   detect a leading number of '0's in a range value of an input stream of symbols, a run of '1's in an offset value of the input stream of symbols, and a run of '0's following the run of '1' in the offset value; and
   output a bitstream based on an iteration window for a number of renormalization iterations, the iteration window comprising a bit range after the run of '1's in the offset value, the number of renormalization iterations based on the leading number of '0's in the range value.

32. The article of claim 31, further comprising instructions that if executed enable the system to renormalized the range value by shifting the range value by the leading number of '0's.

33. The article of claim 31, further comprising instructions that if executed enable the system to determine a new range value and a new offset value based on the number of renormalization iterations.

34. The article of claim 31, further comprising instructions that if executed enable the system to determine that the offset value falls in an upper range if significant bits of the offset value comprise a run of '1's in the iteration window and to output a value of '1' to the bitstream.

35. The article of claim 34, further comprising instructions that if executed enable the system to reduce the offset value by the lowest value of the upper range after an iteration and multiply the reduced offset value to put the offset value back into the upper range.

36. The article of claim 31, further comprising instructions that if executed enable the system to determine that the offset value falls below an upper range during the run of '0's and to output a value of '0' to the bitstream.

37. The article of claim 31, further comprising instructions that if executed enable the system to latch the iteration window into a register and increment a number of bits outstanding if a last bit in the register comprises a '1' and otherwise output a value of '0' to the bitstream.

38. The article of claim 37, further comprising instructions that if executed enable the system to shift the register by one bit each time the number of bits outstanding is incremented.

39. The article of claim 31, further comprising instructions that if executed enable the system to identify a run of '1's followed by one or more '0's as a particular pattern.

40. The article of claim 39, further comprising instructions that if executed enable the system to output a bitstream at a throughput of 1 bit per cycle.

* * * * *

UNITED STATES PATENT AND TRADEMARK OFFICE
CERTIFICATE OF CORRECTION

PATENT NO. : 7,561,082 B2  Page 1 of 1
APPLICATION NO. : 11/618551
DATED : July 14, 2009
INVENTOR(S) : Karthik Vaithianathan It is certified that error appears in the above-identified patent and that said Letters Patent is hereby corrected as shown below:

On the title page, item (57), under "Abstract", column 2, line 5, delete "'1'in" and insert -- '1' in --, therefor.

In column 16, line 39, in Claim 1, delete "'1'in" and insert -- '1' in --, therefor.

In column 16, line 47, in Claim 2, delete "renormalized" and insert -- renormalize --, therefor.

In column 17, line 24, in Claim 12, delete "renormalized" and insert -- renormalize --, therefor.

In column 18, line 46, in Claim 32, delete "renormalized" and insert -- renormalize --, therefor.

Signed and Sealed this

Sixteenth Day of March, 2010

David J. Kappos
*Director of the United States Patent and Trademark Office*